US009773829B2

United States Patent
Zheng et al.

(10) Patent No.: US 9,773,829 B2
(45) Date of Patent: Sep. 26, 2017

(54) THROUGH-SEMICONDUCTOR-VIA CAPPING LAYER AS ETCH STOP LAYER

(71) Applicant: OmniVision Technologies, Inc., Santa Clara, CA (US)

(72) Inventors: Yuanwei Zheng, San Jose, CA (US); Gang Chen, San Jose, CA (US); Duli Mao, Sunnyvale, CA (US); Dyson Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 85 days.

(21) Appl. No.: 15/014,787

(22) Filed: Feb. 3, 2016

(65) Prior Publication Data

US 2017/0221951 A1    Aug. 3, 2017

(51) Int. Cl.
*H01L 27/14* (2006.01)
*H01L 27/146* (2006.01)

(52) U.S. Cl.
CPC .... *H01L 27/14636* (2013.01); *H01L 27/1464* (2013.01); *H01L 27/1469* (2013.01); *H01L 27/14621* (2013.01); *H01L 27/14645* (2013.01); *H01L 27/14685* (2013.01); *H01L 27/14687* (2013.01); *H01L 27/14689* (2013.01)

(58) Field of Classification Search
CPC ......... H01L 27/14636; H01L 27/14621; H01L 27/1464; H01L 27/14685; H01L 27/14687; H01L 27/14689; H01L 27/1469
See application file for complete search history.

(56) References Cited

U.S. PATENT DOCUMENTS

| 2013/0113065 A1* | 5/2013 | Qian | H01L 27/14636 257/437 |
| 2013/0307103 A1* | 11/2013 | Lin | H01L 27/14621 257/432 |
| 2016/0284753 A1* | 9/2016 | Komai | H01L 27/14634 |

* cited by examiner

Primary Examiner — Whitney T Moore
Assistant Examiner — Joseph Galvin, III
(74) Attorney, Agent, or Firm — Christensen O'Connor Johnson Kindness PLLC

(57) ABSTRACT

A method of image sensor fabrication includes providing a semiconductor material, an insulation layer, and a logic layer, where the semiconductor material includes a plurality of photodiodes. A through-semiconductor-via is formed which extends from the semiconductor material, through the insulation layer, and into the logic layer. The through-semiconductor-via is capped with a capping layer. A metal pad is disposed in a first trench in the semiconductor material. Insulating material is deposited on the capping layer, and in the first trench in the semiconductor material. A resist is deposited in a second trench in the insulating material, and the second trench in the insulating material is aligned with the metal pad. The insulating material is removed to expose the capping layer, and a portion of the capping layer disposed proximate to the plurality of photodiodes is also removed. A metal grid is formed proximate to the plurality of photodiodes.

20 Claims, 6 Drawing Sheets

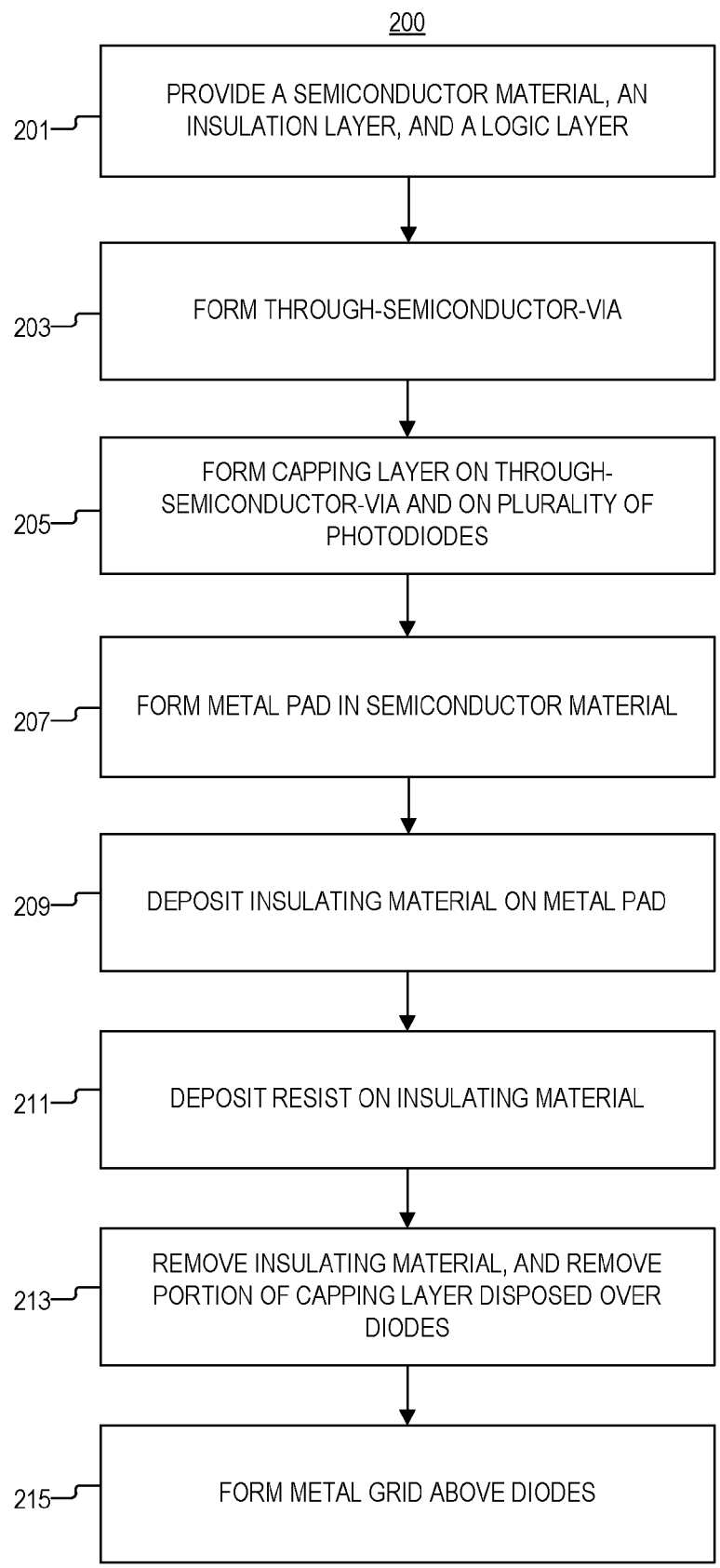

THROUGH-SEMICONDUCTOR-VIA CAPPING LAYER AS ETCH STOP LAYER

TECHNICAL FIELD

This disclosure relates generally to image sensors, and in particular but not exclusively, relates to methods of image sensor fabrication.

BACKGROUND INFORMATION

Image sensors have become ubiquitous. They are widely used in digital still cameras, cellular phones, security cameras, as well as, medical, automobile, and other applications. The technology used to manufacture image sensors has continued to advance at a great pace. For example, the demands of higher resolution and lower power consumption have encouraged the further miniaturization and integration of these devices.

CMOS image sensors are sometimes regarded the first three dimensional semiconductor devices in volume manufacturing. Chip stacking was integrated into fabrication procedures with the advent of backside illuminated image sensors, which involve reversing the structural order of the circuitry, lenses, and photodiodes from traditional frontside illuminated devices. Many backside illuminated devices require attaching the photoactive chip (i.e., the chip with photodiodes) to a logic wafer. This may be accomplished by flipping the photoactive chip, thinning the backside of the chip, and bonding the frontside of the chip to a readout layer using a direct oxide bond. Through-silicon-vias are often used as interconnects around the perimeter of backside illuminated devices.

However, with increased complexity of device architecture comes increased fabrication time and cost. Additional process steps may drive up production expenses and lower profit margins.

BRIEF DESCRIPTION OF THE DRAWINGS

Non-limiting and non-exhaustive examples of the invention are described with reference to the following figures, wherein like reference numerals refer to like parts throughout the various views unless otherwise specified.

FIG. 2 is a flow chart illustrating an example method of image sensor fabrication, in accordance with the teachings of the present invention.

Figure 1A:
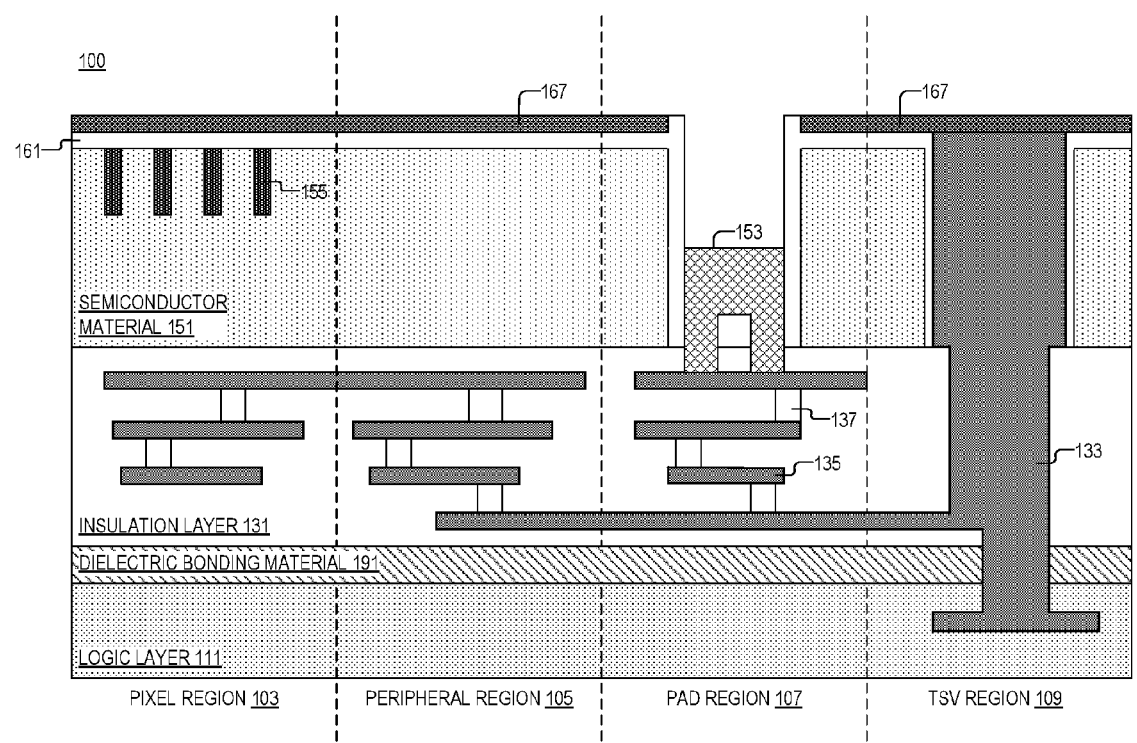
FIGS. 1A-1E illustrate an example method of image sensor fabrication, in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus and method for a through-semiconductor-via capping layer to be used as an etch stop layer are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

FIGS. 1A-1E illustrate an example image sensor 100 during various stages of fabrication. It should be noted that the method of fabricating image sensor 100 illustrated in FIGS. 1A-1E only describes one part of the image sensor fabrication process. Several steps have been omitted in order to avoid obscuring certain aspects. The order in which some or all of FIGS. 1A-1E illustrate the various stages of fabricating image sensor 100 should not be deemed limiting. Rather, one of ordinary skill in the art having the benefit of the present disclosure will understand that the illustrated stages of fabricating image sensor 100 shown in FIGS. 1A-1E may occur in a variety of orders not illustrated, or even in parallel.

FIG. 1A depicts providing semiconductor material 151, insulation layer 131, and logic layer 111 of image sensor 100. Insulation layer 131 is disposed between semiconductor material 151 and logic layer 111. Semiconductor material 151 includes a plurality of photodiodes (in the pixel region 103 and individually separated by deep trench isolation 155), and through-semiconductor-via (TSV) 133 which extends from semiconductor material 151, through insulation layer 131, and into logic layer 111. In the depicted embodiment, dielectric bonding layer 191 is disposed between insulation layer 131 and logic layer 111. TSV 133 extends through dielectric bonding layer 191 to reach logic layer 111.

In the depicted example, metal pad 153 has already been formed and is disposed in a first trench in semiconductor material 151. Metal pad 153 is disposed in pad region 107. Insulation layer 131 includes a plurality of interconnects 135, and metal pad 153 extends through semiconductor material 151 and contacts plurality of interconnects 135. Furthermore, through-semiconductor-via 133 extends laterally into insulation layer 131 and is electrically coupled to plurality of interconnects 135. Individual interconnects in plurality of interconnects 135 are connected to one another (by metal vias 137) and to the portion of through-semiconductor-via 133 that extends into the insulation layer 131. In one example, a portion of through-semiconductor-via 133 extends from TSV region 109, through pad region 107, and into peripheral region 105.

In one or more examples, forming metal pad 153 includes: (1) etching a first trench through capping layer 167 and into semiconductor material 151; (2) forming insulating material 161 on walls of the first trench; and (3) depositing metal pad 153 in the first trench. In this example, forming insulating material 161 on the walls of the first trench may involve filling the first trench with insulating material 161, and etching at least one hole in insulating material 161. Then metal pad 153 may be deposited in the at least one hole. In one example, insulating material 161 may include silicon oxide or any other suitable oxide.

In one or more examples, metal pad 153 may include aluminum and plurality of interconnects 135 may include copper. However, in other examples, metal pad 153 and plurality of interconnects 135 may include any suitable conductor such as, aluminum, copper, titanium, silver, gold, tin, silicon, germanium, or the like.

In the depicted example, capping layer 167 has already been formed on through-semiconductor-via 133, and capping layer 167 is disposed proximate to semiconductor material 151. It should be noted that the lateral bounds of capping layer 167 extend across the lateral bounds of through-semiconductor-via 133 and the lateral bounds of plurality of photodiodes (i.e., the area between deep trench isolation 155). In one or more examples, capping layer 167 may include SiN or any other suitable dielectric and may help prevent metal in through-semiconductor-via 133 from diffusing out of TSV region 109 during subsequent high temperature processing steps.

Figure 1B:
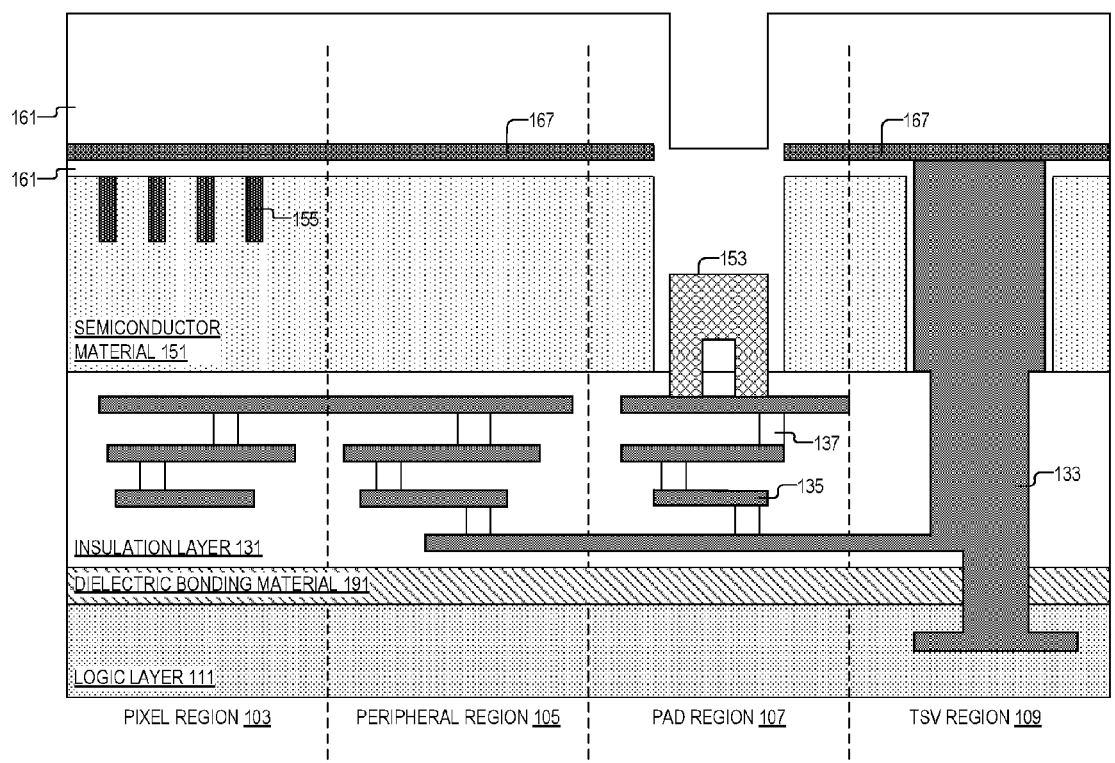

FIG. 1B depicts depositing insulating material 161 on capping layer 167 and in the first trench in semiconductor material 151. Metal pad 153 is covered by insulating material 161. It is worth noting that a second trench is formed in insulating material 161 and the second trench is disposed above metal pad 153. The second trench may be the result of insulating material 161 being deposited in the first trench, which produced a subsequent second trench in insulating material 161.

In one example, depositing insulating material 161 on capping layer 167 includes depositing an oxide (such as silicon oxide or the like), and the oxide is greater than 30 KÅ in thickness (more specifically 40 KÅ in thickness).

Figure 1C:
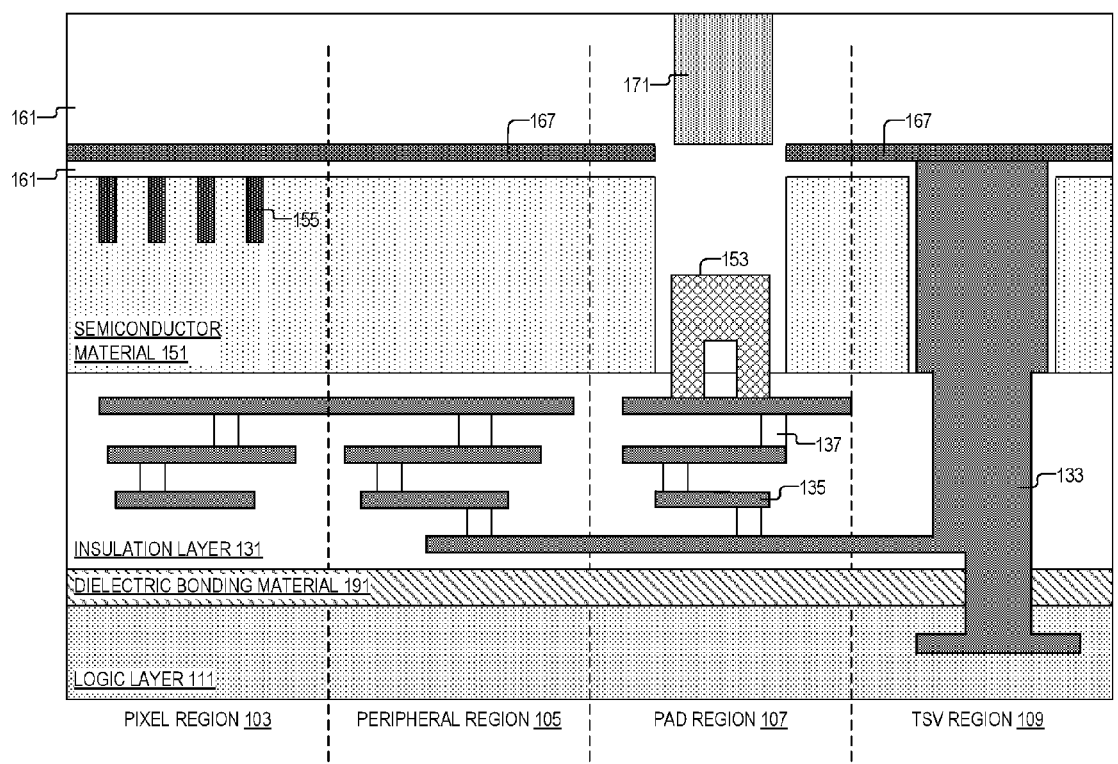

FIG. 1C shows depositing a resist 171 in the second trench in insulating material 161. In one or more examples, resist 171 may include a polymer or small molecule photoresist, or may include a selective etch oxide material.

Figure 1D:
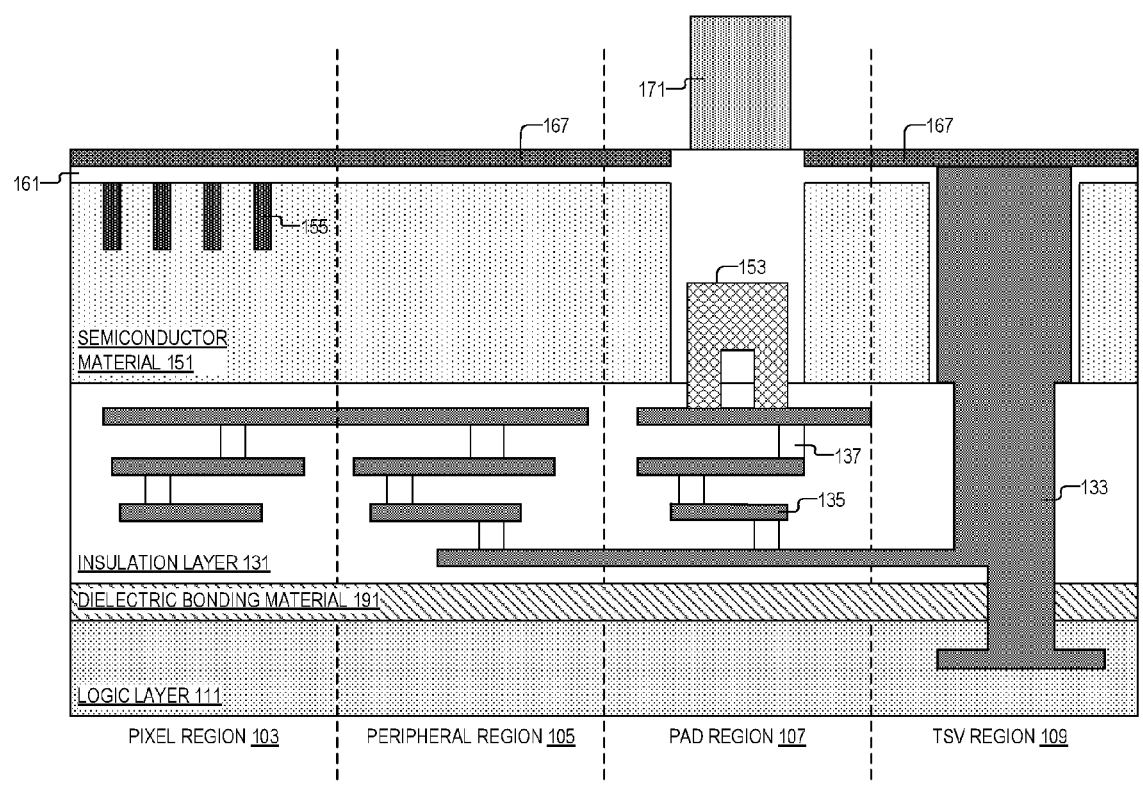

FIG. 1D shows removing insulating material 161 to expose capping layer 167. It is worth noting that the resist 171 is still present on the surface of the device and disposed above metal pad 153. This is because, in the depicted example, a selective etch is used to remove the bulk of insulating material 161 on the surface of the device. In one example, resist 171 may be removed via a solvent wash post-etching.

In one example, polishing away 40 KÅ of oxide material is challenging as the surface roughness of the device may exceed >1000 Å RMS when polishing is completed. This large surface roughness may degrade image quality in a number of ways, including but not limited to, providing an uneven surface to build other layers of device architecture such as color filter layers and microlenses. Accordingly, the process disclosed here allows for an etchant to be used to remove insulating material 161 in order to keep surface roughness low and not degrade final image sensor quality.

Figure 1E:
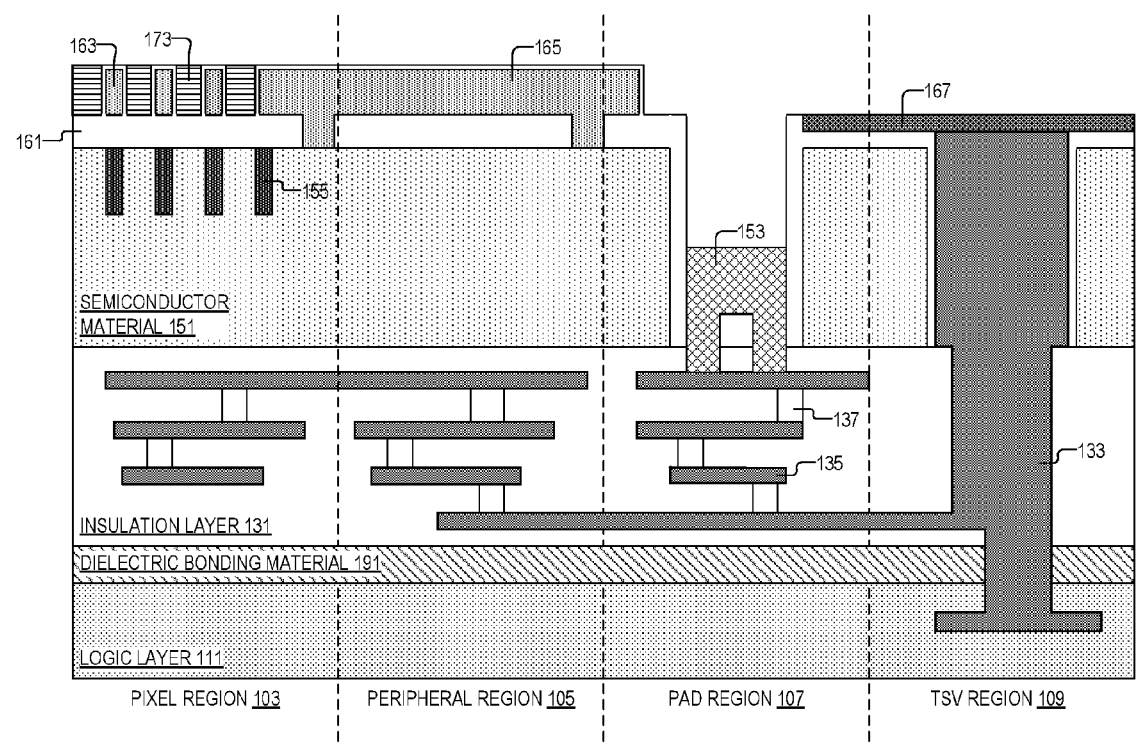

FIG. 1E shows removing a portion of capping layer 167 disposed proximate to the plurality of photodiodes, and forming metal grid 163 proximate to the plurality of photodiodes, such that metal grid 163 is optically aligned with the plurality of photodiodes. Buried color filter array 173 may be formed such that individual color filters in buried color filter array 173 are separated by metal grid 163. In one example, metal grid 163 may prevent optical crosstalk between the plurality of photodiodes. In another or the same example, metal grid 163 may include titanium, and deep trench isolation 155 may include tungsten.

FIG. 2 is a flow chart illustrating an example method 200 of image sensor fabrication. It should be noted that the flow chart in FIG. 2 only describes one part of the image sensor fabrication process. Several steps have been omitted in order to avoid obscuring certain aspects. Furthermore, the order in which some or all of process blocks 201-215 appear in method 200 should not be deemed limiting. Rather, one of ordinary skill in the art having the benefit of the present disclosure will understand that some of method 200 may be executed in a variety of orders not illustrated, or even in parallel.

Process block 201 depicts providing a semiconductor material (e.g., semiconductor material 151), an insulation layer (e.g., insulation layer 131), and a logic layer (e.g., logic layer 111). In one example, the insulation layer is disposed between the semiconductor material and the logic layer. In one example, the logic layer may include control circuitry and readout circuitry. Control circuitry may be coupled to a plurality of photodiodes in the semiconductor material and control image acquisition. Readout circuitry may be coupled to the plurality of photodiodes to read out image charge generated in the plurality of photodiodes. Logic layer may also include other hardware/software that controls the image sensor and/or manipulates image data extracted from the image sensor.

Process block 203 illustrates forming a through-semiconductor-via (e.g., through-semiconductor-via 133). In one or more examples, the through-semiconductor-via may be a through-silicon-via if the semiconductor material is a silicon wafer/layer. Forming the through-semiconductor-via may be achieved by etching a hole that extends from the semiconductor material through the insulation layer, and into the logic layer. The via may then be backfilled with insulating materials (such as oxides) and conductive materials (such as metals like copper). The insulating materials may be disposed on the walls of the hole to insulate other components of device architecture from the conductive portions of the through-semiconductor-via.

Process block 205 shows forming a capping layer on the through-semiconductor-via and on the plurality of photodiodes. In one example, the capping layer includes silicon nitride but may include any other suitable oxide or nitride materials. In one example, the capping layer is disposed on the portion of the through-semiconductor-via that is exposed after the deposition of conductive materials in the through-semiconductor-via. This may be to prevent out-diffusion of copper or other metals used in the through-semiconductor via.

As a byproduct of forming the capping layer on the through-semiconductor-via, the pixel region of the device is also covered by the capping layer. In the instant example, this is desirable since the capping layer doubles as a selective etch stop layer in a subsequent process block, and prevents damage to the plurality of photodiodes.

In process block 207, a metal pad is formed in the semiconductor material. The metal pad may be disposed such that it contacts metal interconnects in the insulation layer. In one example, the metal pad is aluminum. In order to form the metal pad, the semiconductor material must be etched to create a hole that extends from the surface of the semiconductor material into the insulation layer. In one or more examples, the portion of the hole in the semiconductor material is lined with an insulating material in order to prevent unwanted electrical communication between the metal pad and semiconductor material. Lining the hole in the semiconductor material may be achieved by backfilling the hole with an insulating material and etching one or more smaller holes in the insulating material to contact the electrical interconnects in the insulation layer.

Process block 209 depicts depositing insulating material on the metal pad. In one example, this may keep the metal pad from being damaged during subsequent semiconductor process steps. In another or the same example, depositing insulating material on the metal pad may include depositing an oxide such as silicon oxide or the like.

It is worth noting that when depositing insulating material on the metal pad, insulating material is also built up on the surface of the semiconductor material/capping layer. This may result in a divot (or second trench) in the insulating material above the metal pad.

In process block 211, a resist is deposited in the second trench above the metal pad. This allows for a subsequent etch of the insulating material without damaging the metal pad.

Process block 213 depicts removing the insulating material and removing the portion of the capping layer disposed over the plurality of photodiodes. The portion of the capping layer disposed over the through-semiconductor-via will remain because, as previously stated, this prevents metal out diffusion which may contaminate other portions of the device.

Removing the insulating material from the surface of the semiconductor material may be achieved via chemical etching, since the capping layer will impede the progress of the chemical etchant prior to the etchant reaching the semiconductor material. Residual insulating material and the capping layer may be removed via chemical mechanical polish (CMP) or the like. Furthermore, the resist may be removed with conventional means such as solvent wash or chemical etching depending on the type of resist employed.

Process block 215 illustrates forming the metal grid above the plurality of photodiodes. Forming the metal grid is accomplished by selectively patterning and depositing a metal. Patterning may involve using a photoresist or the like to make a predefined pattern. In one example a buried color filter layer is deposited between the metal grid such that the metal grid prevents optical cross talk between individual photodiodes in the plurality of photodiodes. In one example, a metal shield (i.e., metal shield 165) is also fabricated in the peripheral region of the semiconductor material. The metal shield may be a byproduct of forming the metal grid, and may be disposed to prevent light from reaching layers/elements of photoactive device architecture.

In one example, method 200 may constitute several critical steps in the formation of a high-performance image sensor that is included in a digital camera, cell phone, laptop computer, or the like. Without method 200 the production cost of the image sensor may be significantly higher.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method of image sensor fabrication, comprising:
   providing a semiconductor material, an insulation layer, and a logic layer, wherein the insulation layer is disposed between the semiconductor material and the logic layer, wherein the semiconductor material includes a plurality of photodiodes, and wherein a through-semiconductor-via extends from the semiconductor material through the insulation layer and into the logic layer;
   capping, with a capping layer, the through-semiconductor-via, wherein the capping layer is disposed proximate to the semiconductor material, and wherein lateral bounds of the capping layer extend across lateral bounds of the through-semiconductor-via and lateral bounds of the plurality of photodiodes;
   forming a metal pad disposed in a first trench in the semiconductor material;
   depositing insulating material on the capping layer and in the first trench in the semiconductor material, wherein the metal pad is covered by the insulating material;
   depositing a resist in a second trench in the insulating material, wherein the second trench in the insulating material is aligned with the metal pad;
   removing the insulating material to expose the capping layer;
   removing a portion of the capping layer disposed proximate to the plurality of photodiodes; and
   forming a metal grid proximate to the plurality of photodiodes.

2. The method of claim 1, wherein the insulation layer includes a plurality of interconnects, and wherein the metal pad extends through the semiconductor material and contacts the plurality of interconnects.

3. The method of claim 2, wherein the through-semiconductor-via extends into the insulation layer and is electrically coupled to the plurality of interconnects, and wherein individual interconnects in the plurality of interconnects are connected to one another and to the through-semiconductor-via.

4. The method of claim 2, wherein the metal pad includes aluminum and the plurality of interconnects include copper.

5. The method of claim 1, wherein individual photodiodes in the plurality of photodiodes are separated by deep trench isolation, and wherein the metal grid is optically aligned with the plurality of photodiodes.

6. The method of claim 5, further comprising forming a buried color filter array, wherein individual color filters in the buried color filter array are separated by the metal grid, and wherein the metal grid prevents optical crosstalk between the plurality of photodiodes.

7. The method of claim 5, wherein the deep trench isolation includes tungsten, and wherein the metal grid includes titanium.

8. The method of claim 1, wherein the insulating material includes silicon oxide and the capping layer includes silicon nitride.

9. The method of claim 1, wherein forming the metal pad includes:
   etching the first trench through the capping layer and into the semiconductor material;
   forming the insulating material on walls of the first trench; and
   depositing the metal pad in the first trench.

10. The method of claim 1, wherein depositing the insulating material on the capping layer includes depositing an oxide, and wherein the oxide is greater than 30 KÅ in thickness.

11. The method of claim 1, wherein the capping layer includes silicon nitride.

12. A method of semiconductor device fabrication, comprising:
   forming at least three device layers including a semiconductor material, an insulation layer, and a logic layer, wherein the insulation layer is disposed between the semiconductor material and the logic layer, and wherein the semiconductor material includes a plurality of photodiodes;
   forming a through-semiconductor-via that extends from the semiconductor material to the logic layer;
   forming a capping layer on the through-semiconductor-via, wherein lateral bounds of the capping layer extend across the through-semiconductor-via and the plurality of photodiodes;
   forming a metal pad disposed in a first trench in the semiconductor material;
   depositing insulating material on the capping layer and in the first trench in the semiconductor material;
   depositing a resist in a second trench in the insulating material, wherein the second trench in the insulating material is aligned with the metal pad;
   removing the insulating material and removing a portion of the capping layer disposed proximate to the plurality of photodiodes; and
   forming a metal grid over the plurality of photodiodes.

13. The method of claim 12, wherein the insulation layer includes a plurality of interconnects, wherein the metal pad extends through the semiconductor material and contacts the plurality of interconnects, and wherein the plurality of interconnects are coupled to the through-semiconductor-via.

14. The method of claim 13, wherein the through-semiconductor-via extends into the insulation layer and is electrically coupled to the plurality of interconnects, and wherein individual interconnects in the plurality of interconnects are connected to one another and to the through-semiconductor-via.

15. The method of claim 13, wherein the plurality of interconnects include copper.

16. The method of claim 12, wherein individual photodiodes in the plurality of photodiodes are separated by deep trench isolation, and wherein the metal grid is optically aligned with the plurality of photodiodes.

17. The method of claim 12, wherein forming the metal pad includes:
   etching the first trench through the capping layer and into the semiconductor material;
   forming the insulating material on walls of the first trench; and
   depositing the metal pad in the first trench.

18. The method of claim 17, wherein forming the insulating material on the walls of the first trench includes:
   filling the first trench in the semiconductor material with the insulating material; and
   etching at least one hole in the insulating material;
   and depositing the metal pad in the at least one hole, wherein the metal pad includes aluminum.

19. The method of claim 12, wherein depositing the insulating material on the capping layer includes depositing an oxide, and wherein the oxide is greater than 30 KÅ in thickness.

20. The method of claim 12, wherein removing the insulating material includes etching the insulating material until the capping layer is exposed, and using chemical mechanical polishing to remove residual insulating material.

* * * * *